United States Patent [19]

Ehrler

[11] Patent Number: 4,999,570
[45] Date of Patent: Mar. 12, 1991

[54] DEVICE FOR MAKING NON-CONTACTING MEASUREMENTS OF ELECTRIC FIELDS WHICH ARE STATICAL AND/OR VARYING IN TIME

[75] Inventor: Horst Ehrler, Pfinztal, Fed. Rep. of Germany

[73] Assignee: Kernforschungszentrum Karlsruhe GmbH, Karlsruhe, Fed. Rep. of Germany

[21] Appl. No.: 268,945

[22] Filed: Nov. 8, 1988

[30] Foreign Application Priority Data

Nov. 28, 1987 [DE] Fed. Rep. of Germany ....... 3740468

[51] Int. Cl.⁵ ............................................. G01R 29/00
[52] U.S. Cl. ...................................... 324/96; 350/356
[58] Field of Search ............................. 324/96, 117 R; 332/7.51; 350/356, 374, 376; 356/368

[56] References Cited

U.S. PATENT DOCUMENTS 4,631,402 12/1986 Nagatsuma et al. .................. 324/96

FOREIGN PATENT DOCUMENTS 160071 10/1982 Japan ..................................... 324/96

Primary Examiner—Reinhard J. Eisenzopf
Assistant Examiner—Edward Urban
Attorney, Agent, or Firm—Spencer & Frank

[57] ABSTRACT

A device for measuring electric fields, including electric fields having frequencies extending into the GHz range, including an optically active crystal sensor having an optical property which changes depending upon the strength of an applied electric field; a body contacting the optically active crystal sensor at a common surface portion, the body having a dielectric constant which is different from that of the optically active crystal sensor; a first optical conductor connected to the optically active crystal sensor for supplying light thereto; a device for polarizing the light supplied to the optically active crystal sensor; an analyzer device for converting shift in phase of the light transmitted through the optically active crystal sensor into a change in intensity of the transmitted light; a second optical conductor connected to the analyzer device for conducting the transmitted light from the analyzer device; and a detector for detecting change in the intensity of the transmitted light connected to the second optical conductor.

9 Claims, 7 Drawing Sheets a)

b) PRIOR ART c) PRIOR ART d) PRIOR ART e) PRIOR ART f)

DEVICE FOR MAKING NON-CONTACTING MEASUREMENTS OF ELECTRIC FIELDS WHICH ARE STATICAL AND/OR VARYING IN TIME

BACKGROUND OF THE INVENTION

The invention relates to an apparatus for making noncontacting measurements of electric fields which extend into the GHz range and or are statical by utilizing the Pockels effect in optically active crystals, with the crystal serving as a sensor and being subjected to the influence of the electric field.

In industrial technology and research there often exists the problem of measuring voltage under greatly limited measuring conditions, such as:

(1) the separation of potentials, i.e. it is not possible to measure voltage from either the ground end or the other end of a sensor lead line;

(2) interference-free transmission of the measurement signal even through stray electromagnetic fields, and also specifically through high-frequency interfering fields;

(3) measurements under difficult environmental conditions, e.g. high temperatures, explosion endangered rooms (where it is necessary to avoid spark development), or chemically active liquids;

(4) the measuring probe must be of ultrasmall dimensions so as to avoid excessively influencing the field to be measured;

(5) the measuring sensors must be composed of a dielectric medium which is an insulator, to avoid use of metal since metal interferes with the given field distribution (which would thereby cause the measured value to be inaccurate), whereas an insulator itself does not carry current and therefore reduces the danger of an electric spark-over to the measuring probe; and (6) The capability for measurement throughout a wide frequency bandwidth, particularly in connection with high-frequency fields.

Generally, known measuring methods employ metal sensors for this purpose, such as a Rogowski coil or a capacitive voltage divider. Such measuring methods have considerable drawbacks. In such known measuring methods, feasible measurements have a bandwidth only in a range from 70 to 80 MHz with the consequence that the signals are accurate only to 12 to 14 nsec. Usually metal sensors cannot be employed where measurements would actually be of interest, namely in regions having high electric field intensities, such as, for example, in a pseudo spark chamber or other complex devices. Furthermore, with such known types of measuring devices, the measured signal value is often highly inaccurate with respect to the actual signal value, and high-frequency interference effects occur due to resonances with the metal sensors, oscillations of the sensors, and grounding problems.

SUMMARY OF THE INVENTION

It is an object of the present invention to provide a sensor for measuring voltages and electric field intensities without necessity for contacting any portions of an associated apparatus and without significant interference with the phenomenon to be measured (i.e., primarily electric field intensity or phenomena that in the past were interfered with by a metallic, current conducting measuring probe), wherein the sensor is capable of operation throughout a wide bandwidth of frequency variation of a corresponding electric field, is capable of performing measurements without necessity for a ground lead, has small dimensions, and is reliable in use even under difficult measuring conditions such as interfering electromagnetic fields (high-frequency fields), high/low temperatures, and chemically active surroundings. Additionally, the sensor should permit the measurement of electric fields at locations which in the past have not been accessible at all to measurements and it should also enable the user to master even more difficult measuring tasks in an uncomplicated manner.

The above and other objects are accomplished according to the invention by the provision of an apparatus for measuring electric fields which vary, including electric fields having frequencies extending into the GHz range, the apparatus including an optically active crystal sensor having an optical property which changes depending upon the strength of an applied electric field; a body contacting the optically active crystal sensor at a common surface portion, the body having a dielectric constant which is different from that of the optically active crystal sensor; a first optical conductor connected to the optically active crystal sensor for supplying light thereto; a device for polarizing the light supplied to the optically active crystal sensor; an analyzer device for converting shift in phase of the light transmitted through the optically active crystal sensor into a change in intensity of the transmitted light; a second optical conductor connected to the analyzer device for conducting the transmitted light from the analyzer device; and a detector for detecting change in the intensity of the transmitted light connected to the second optical conductor.

Particular advantages of the invention include:

(a) the optical sensors are composed of a dielectric medium which in contrast to metallic sensors known in the prior art, can be used directly at a location of high electric field intensities;

(b) as a consequence of the use of a dielectric medium for the composition of the optical sensors, the optical sensor does not interfere with, or only insignificantly interferes with the phenomena to be measured;

(c) there is no electromagnetic influence due to the electric field on the measuring apparatus, and therefore there are no grounding problems; and (d) the electric field strength can be measured over a wide bandwidth of electric field frequencies in a range from 1 to 100 GHz.

For example, for an optical crystal operating at 40 GHz, a time resolution of 25 psec is achieved, while the optical conductor can transmit light at 400–800 MHz/km, e.g. 4 to 8 GHz per 100 m of optical conductor.

Another advantage of the optical measuring method according to the invention is that, even if many measuring locations are employed (up to 60 and more, depending on the detector system), all signals are automatically synchronized, i.e. no time correlation errors occur due to differences in triggering thresholds among the sensors or detectors.

BRIEF DESCRIPTION OF THE DRAWINGS

The invention will be described in greater detail below with reference to an embodiment that is illustrated in the drawings.

DETAILED DESCRIPTION OF THE PREFERRED EMBODIMENT

Figure 1:
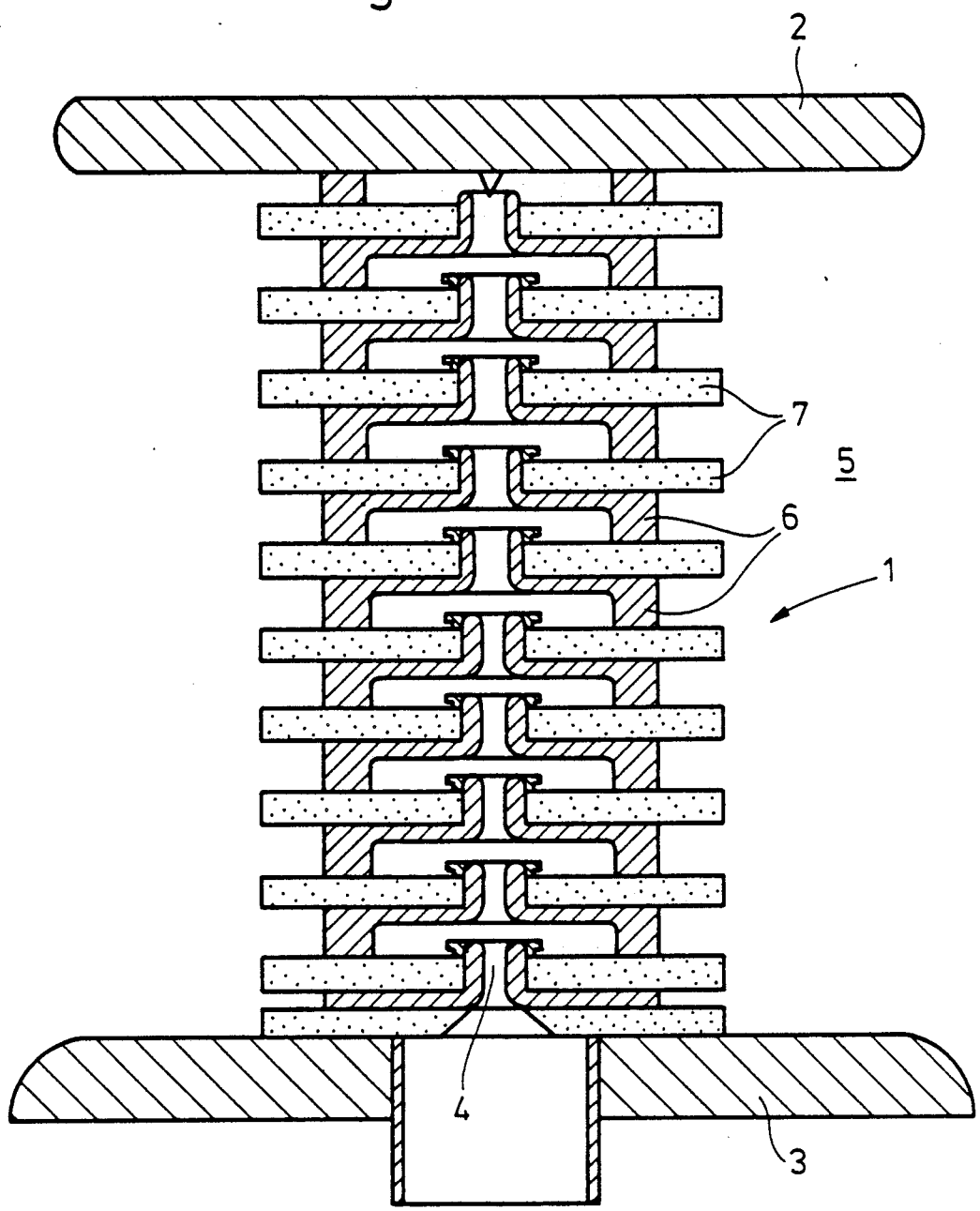
FIG. 1 is a front sectional view of a psuedo spark chamber whose potential distribution is to be measured.

FIG. 1 shows a so-called pseudo spark chamber or diode 1. This is a plasma-physical system whose precise operation is still unknown. Its known operation is as follows: a voltage of a maximum length of 100 nanoseconds is applied between an anode 2 and a cathode 3 of the diode 1, with an amplitude up to 800 kV. A gas pressure of about 0.3 mbar hydrogen exists in an interior portion 4 of the diode 1. The entire arrangement is disposed in demineralized water which serves as an insulator 5. The object of the measurement is to determine the potential distribution between individual ones of a plurality of intermediate electrodes 6 of the diode 1 under these extreme conditions. The electrodes 6 are separated by a plurality of insulators 7.

Figure 2:
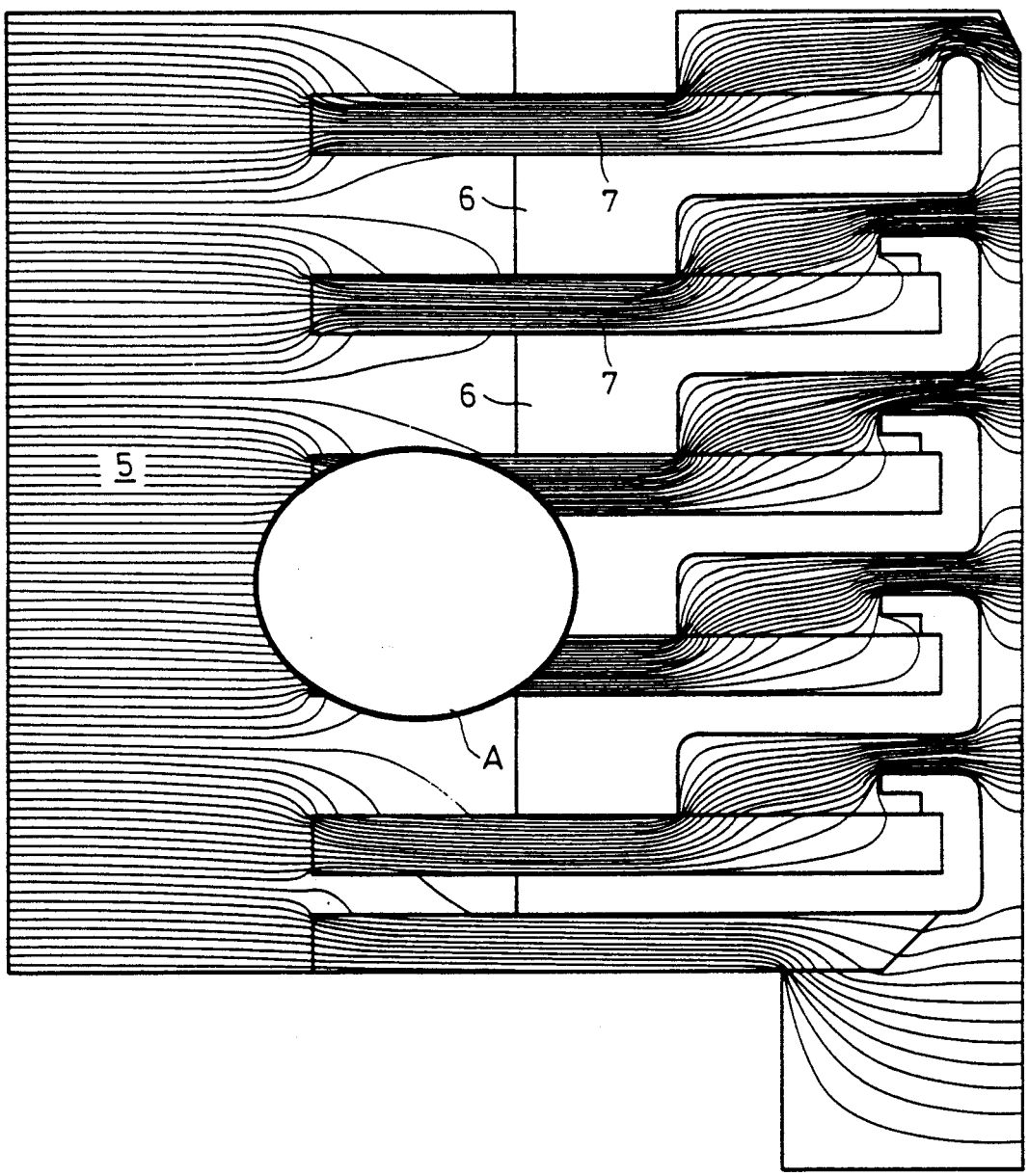
FIG. 2 is an enlarged, schematic view of the left side of the psuedo spark chamber of FIG. 1 showing equipotential lines.

FIG. 2 shows the calculated equipotential lines of the left hand portion of the diode 1 of FIG. 1 with only six intermediate electrodes 6, taking into consideration the dielectric constants of the material compositions of the intermediate electrodes 6, the insulators 7 and the demineralized water 5 (which is schematically represented within a container having a rectangular outline). A portion A of FIG. 2 is blank; this portion is represented by each of FIGS. 3a through 3f which show in fine detail the potential lines in the absence of a sensor (FIG. 3a), how the potential lines are affected by the presence of a prior art sensor (FIGS. 3b through 3e), and how the potential lines are affected by the presence of a sensor according to the present invention (FIG. 3f).

Figure 3:
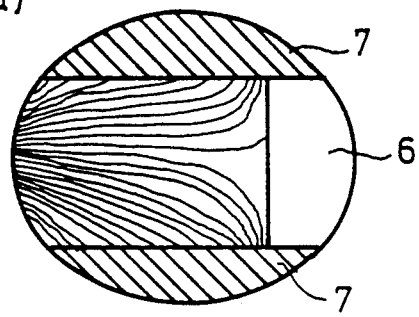
FIGS. 3a through 3f are enlarged schematic views of the portion labeled "A" in FIG. 2, showing equipotential lines in fine resolution for the situation where no sensor is present (FIG. 3a), where a sensor according to the prior art is disposed in a variety of positions (FIGS. 3b through 3e), and where a sensor according to the invention is used (FIG. 3f).
Figure 3:
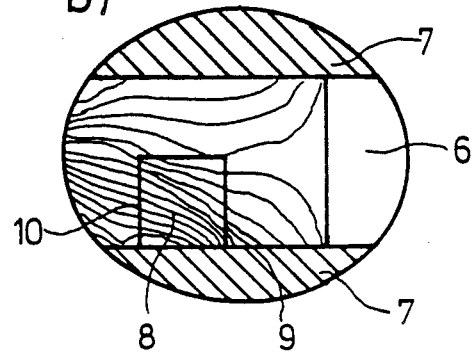
Figure 3:
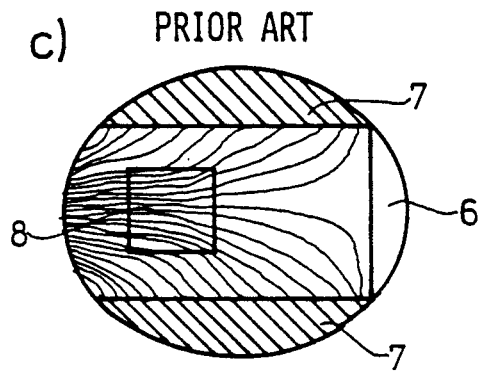
Figure 3:
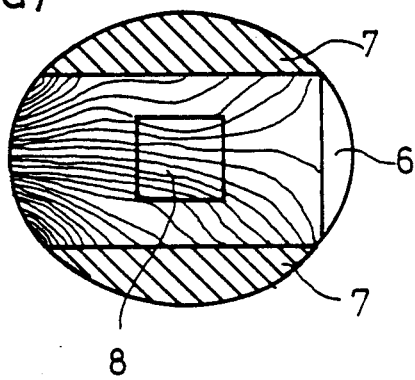
Figure 3:
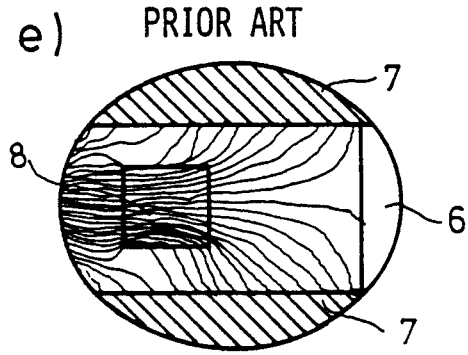
Figure 3:
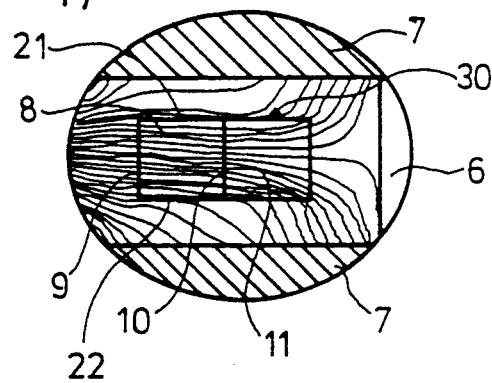

FIGS. 3a to 3f show the region A of FIG. 2 in relatively finer resolution, and depict the potential lines existing in the space between a pair of the insulators 7 and outwardly from an adjacent one of the electrodes 6. FIG. 3a shows the potential lines as they exist initially without a sensor being present. FIGS. 3b through 3e show a prior art sensor element 8, which has a pair of opposed sides 9 and 10 and another pair of opposed sides 21 and 22, disposed at various positions within the space between the pair of insulators 7 and near the electrode 6. In FIGS. 3b-3e, the equipotential lines are never all perpendicular to both of the opposing faces 9 and 10, and instead some of the equipotential lines leave the crystal 8 at the sides 21 and 22 regardless of the position of the crystal 8. Since the electric field lines are perpendicular to these equipotential lines, it is not ensured that the electric field intensity vector E is perpendicular to the (1,1,1) plane of the crystal 8. This relationship of the electric field intensity vector E to the (1,1,1) plane of the crystal 8 is, however, a prerequisite for a correct measurement in the application of the Pockels effect according to the invention.

FIG. 3f shows a sensor 30 according to the present invention. An additional body is attached to the crystal 8 and serves as a potential line lens 11. The potential line lens 11 has the same right rectangular prismatic shape as the crystal 8, but has a significantly lower dielectric constant than both that of the crystal 8 and that of the surrounding medium, and is disposed between the crystal 8 and the electrode 6. This potential line lens 11 causes the electric field intensity vector E to be perpendicular to the crystal surfaces 9 and 10 respectively, and thus perpendicular to the (1,1,1) plane of the crystal 8, which has been correspondingly cut to produce this resultant orientation between the crystal surfaces 9 and 10 and the (1,1,1) plane. The potential line lens 11 may be configured to serve as a carrier for the crystal 8. The potential line lens 11 may also be configured to serve as a carrier for a light supply member and for a light receiving member, which are discussed further hereunder.

Figure 4:
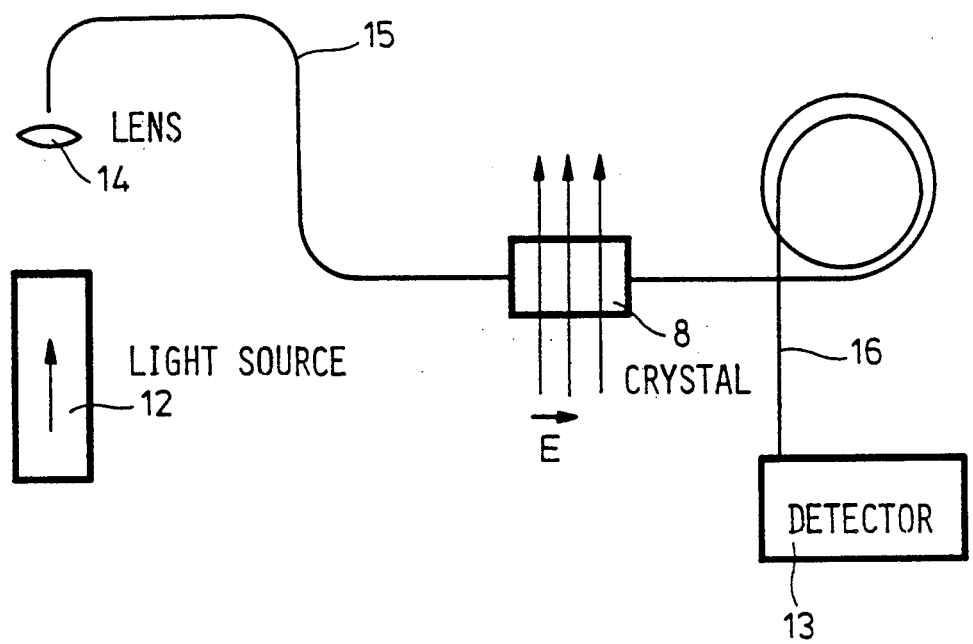
FIG. 4 is a schematic illustration of a fiber optic apparatus according to the present invention for measuring electrical fields or voltages.

FIG. 4 shows a fiber optic sensor apparatus according to the invention for measuring electric fields or voltages. A light source 12 is provided to supply light to a multimode optical conductor 15. The light source 12 is preferably an HeNe laser light source, however the light source 12 need not be a laser; depending on the desired time resolution and the detector system 13, less intensive light sources are also sufficient. The light of the HeNe laser light source 12 is coupled via a microscope objective lens system 14 into the multimode optical conductor 15. At an outlet end of the optical conductor 15, the light is focused on a surface of the crystal 8. The light transmitted through the crystal sensor 8 is received by a further optical conductor 16 and is conducted to a detector 13. The crystal 8 forms part of the fiber optic sensor 30 for measuring the electric field intensity. The electric field intensity vector (E) is identified by arrows. The equipotential lines are indicated by a plurality of parallel arrows (unnumbered) which are perpendicular to the electric field intensity vector (E).

Figure 5:
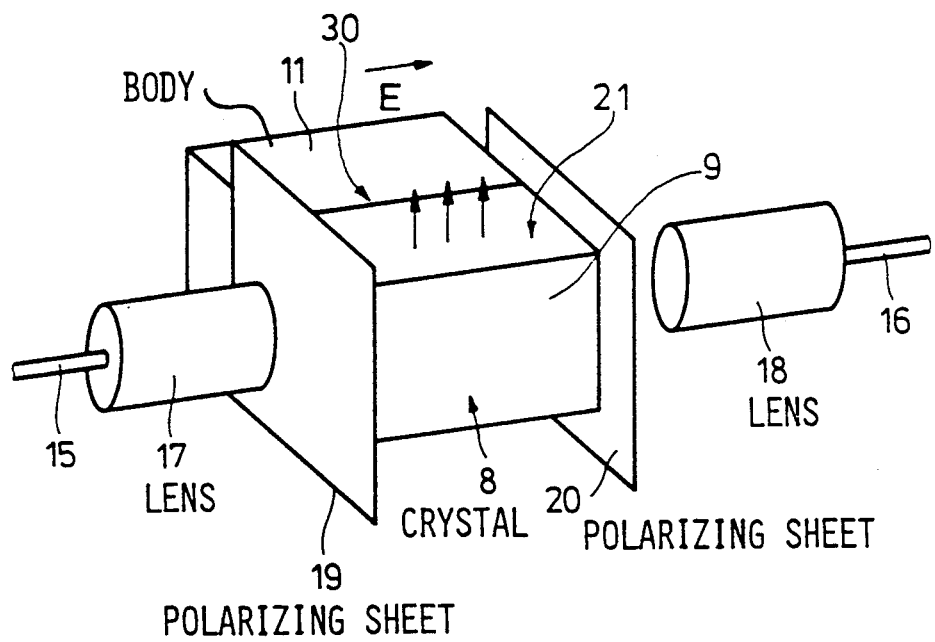
FIG. 5 is a perspective exploded view of a sensor according to the present invention.

FIG. 5 shows the detailed structure of a sensor 30 according to the invention. A light outlet end of the fiber optic conductor 15 is connected to a lens 17. A light inlet end of the fiber optic conductor 16 is connected to a lens 18. A polarizing sheet 19 is disposed between the lens 17 and an inlet side of the crystal 8. An analyzer sheet 20 is disposed between an outlet side of the crystal 8 and the lens 18. An optically transparent epoxy adhesive is preferably used to connect the potential line lens 11 to the crystal 8, to connect the polarizer 19 to the crystal 8, and to connect the crystal 8 to the analyzer 20. FIG. 5 shows the potential line lens 11 and the electric field intensity vector (E). The potential line lens 11 serves as a stabilizing carrier for the crystal 8. The polarization sheet 19 and the analyzer sheet 20, respectively, each rotate the light by 45, so as to indicate a shift in the phase of the light.

Figure 6:
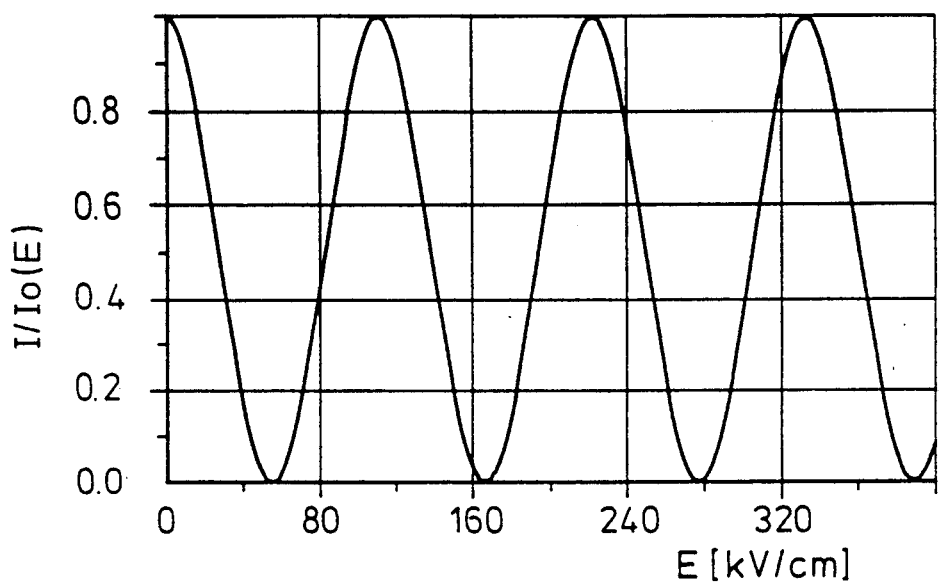
FIG. 6 is a graph depicting the relationship of light intensity with respect to electric field intensity.
Figure 7:
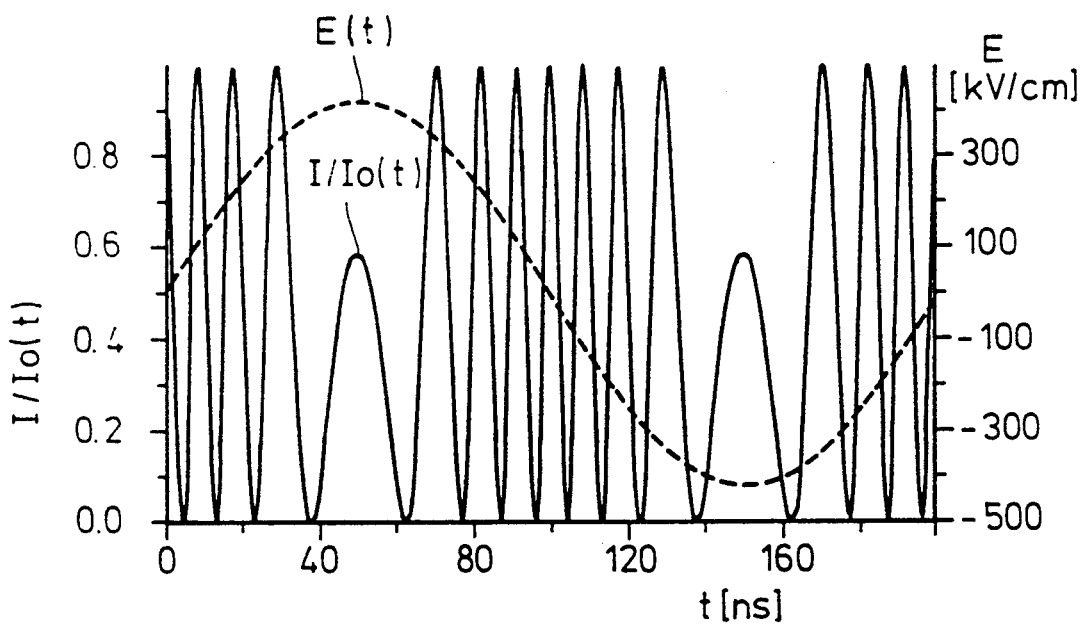
FIG. 7 is a graph depicting the relationship of the light intensity with respect to time.

FIG. 6 shows the graphic relationship between the light intensity I/Io of fiber optic sensor 30 and the electric field intensity (E). The sensitivity of the fiber optic sensor 8 is determined by the length of the crystal, which together with the length of optical conductors 15 and 16 is responsible for the maximum limit frequency which can be measured accurately. By using a second sensor, specifically for high electric fields (which change quickly in time), the unambiguity of the calculated electric field intensity can be obtained by comparison with the measured intensity curve. FIG. 7 graphically depicts the relationship between the light intensity (I/Io) of fiber optic sensor 30 and the time (t) based upon a simulation, with the electric field intensity (E) being shown as a dashed line. FIG. 7 graphically depicts the response of the sensor 30 to an electric field which is a sine function of time.

The apparatus shown in FIG. 5, including the polarizer 19 which is disposed so as to be parallel to the analyzer 20, has the advantage that the maximum intensity Io is measured automatically and need not be determined separately as in the case where the polarizer 19 is arranged perpendicularly to the analyzer 20, which results in a square sine function for the intensity I(t).

As arranged as shown in FIG. 5, the sensor 30 is operated in a transmission mode, wherein light from the light source 12 is transmitted through the crystal 8 without reflection. An alternative arrangement would also be possible employing reflection of the light within the crystal 8, referred to as a reflection mode, however this arrangement is less desirable since it would require a more complex structure involving an additional semi-transparent mirror, and since there would be an associated reduction in the intensity of light leaving the crystal 8. Although the crystal material is of the crystal 8 is not soluble in water, the entire sensor 30 is preferably encased in a thin silicone layer for protection. The light supplied by said first optical conductor is oriented in parallel and is shifted in phase by polarization sheet 19 such that the supplied light is oriented at an angle of approximately 45° to the direction of the local electric field (E).

Figure 8:
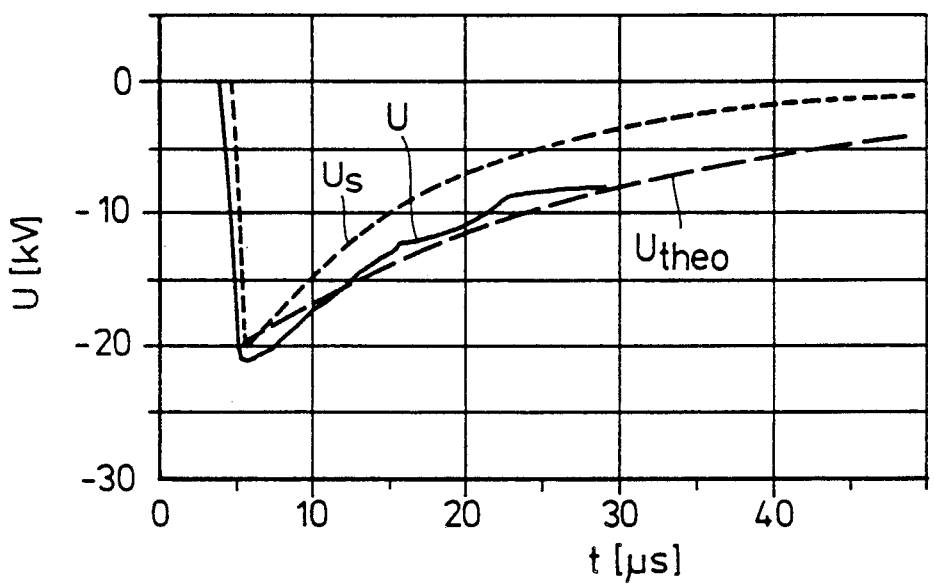
FIGS. 8 through 10 are graphs depicting the relationship of the potential (U) with respect to time (t) for the sensor according to the invention in comparison with prior art methods.
Figure 9:
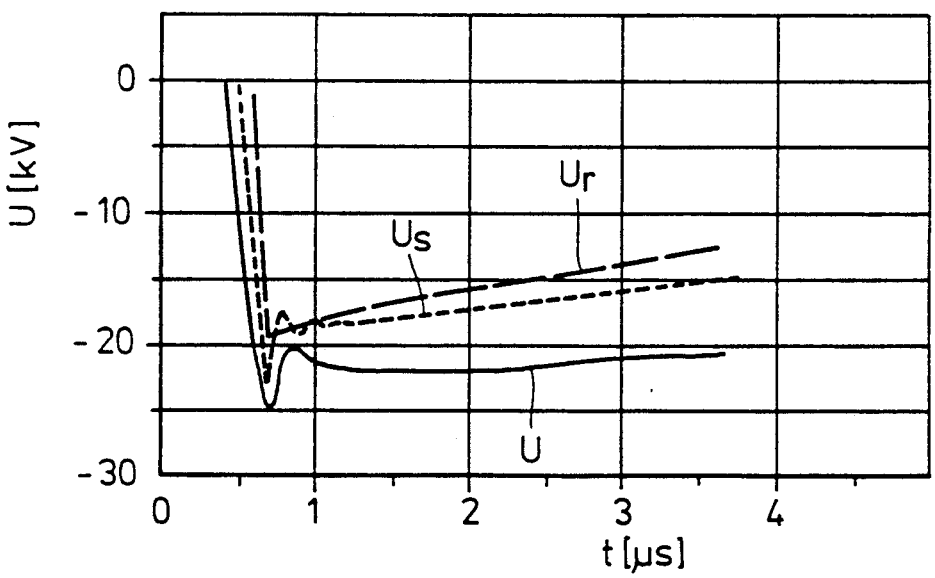
Figure 10:
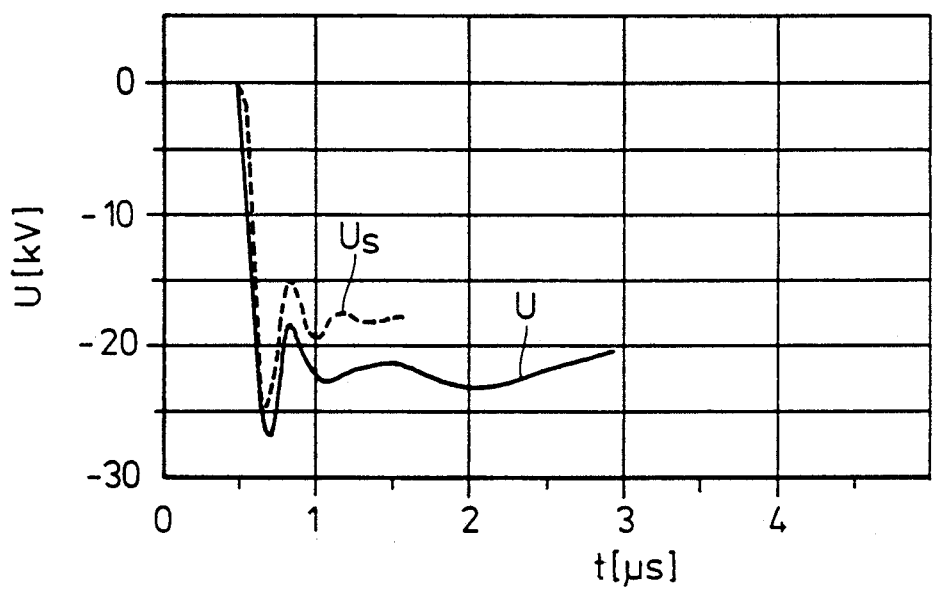

The fiber optic sensor 30 was tested with the arrangement shown in FIGS. 4 and 5 in comparison with two other, purely electrical measuring processes which are still feasible in this measuring range. A summary of important data relating to the measurements shown in FIGS. 8 through 10 is compiled in Tables 1 and 2.

TABLE 1

| characteristic | electrical | optical | deviation |
|---|---|---|---|
| amplitude | 25 kV | 26.1 kV | 4.2% |
| rise time (0 to 100%) | 160 ns | 200 ns | 25% |
| $U_0/U_1$ | 1.78 | 1.5 | 15.7% |
| duration of oscillation | 160 ns | 157 ns | 1.8% |
| pulse duration (RC) | 13/27.5 μs | 27 μs | 50/1.8% |

TABLE 2

| | |
|---|---|
| I(t) | light intensity in the applied E field E(t) |
| $I_0$ | maximum light intensity (without electric field) |
| $n_0$ | refraction index of BGO = 2.0975 |
| $r_{41}$ | electro-optic coefficient = $0.95 \cdot 10^{-12}$ m/V |
| L | length of crystal = 7.5 mm |
| λ | wavelength of the light source = 633 nm |
| E(t) | amount of the electric field intensity |

Although the sensor 30 was developed for significantly higher electric field intensities, it also operates very well at the lower values used in the tests. FIGS. 8, 9 and 10 show the comparative results of several measurements of voltage or potential. The respective solid curves labelled U show the measurements performed using the sensor 30, wherein the sensor 30 has a BGO ($Bi_4Ge_3O_{12}$) crystal 8, and wherein the dashed curves represent the purely electrical measuring processes. The respective curves in FIGS. 8 through 10 labelled $U_s$ represent the voltage measured by means of a high voltage probe. The curve in FIG. 8 labeled $U_{theo}$ represents the theoretical voltage calculated for this situation according to a network analysis. The curve labelled $U_r$ in FIG. 9 represents the voltage measured by means of a resistance divider.

The voltage determined by means of the sensor 30 and the voltage measured electrically coincide in amplitude to within about 4%. The decay time (RC time constant) of the electrically measured signals is noticeably less than that of the sensor signal. The latter, however, coincides to within less than 2% with the theoretical network analysis.

If the signals are considered in a smaller time range, the fine structure of the signals can be seen which are caused by stray capacitances and inductances. The electrical signals detected by the aforementioned two electrical measuring processes as well as the optical signal (sensor) show voltage overshoots; the duration of the oscillations coincides to within less than 2%.

However, a reason for the resulting incorrect values of the signals detected by the aforementioned two electrical measuring processes is the rise time of the signals and their decay which has already been mentioned above. The amplitude ratio of the overshoots is also different. However, these points can be explained by the tendency of the probes used in the aforementioned two electrical measuring processes to differentiate; consequently they simulate faster signals than really exist.

In order to ensure sufficient time resolution in the measurements performed by the sensor 30 and to detect the signals produced by the sensor 30 without bandwidth limiting electronic amplifiers and other electronic components for direct signal processing, the light signals from the sensor 30 are preferably recorded by means of a streak camera (not shown). Such a camera has a time resolution of better than 2 picoseconds. The image generated on the phosphorus screen of the streak camera can then be recorded by an SIT (silicon intensifier tube) video camera and digitalized. Thus, an intensity curve can be obtained as a function of time from which the time-dependent electric field or the voltage can be calculated. A further advantage of the streak camera system is that up to 64 signals can be recorded simultaneously having an automatic correlation over time.

If the demands for time resolution capability and bandwidth are not too high, significantly less expensive and simpler detector systems can also be employed.

Table 2 shows characteristic data for a sensor 30 having the crystal 8. A particularly suitable crystal material is $Bi_4Ge_3O_{12}$ or $Bi_4Si_3O_{12}$. The potential line lens 11 may be composed, for example, of Plexiglas ™. The shape of the crystal 8 and the potential line lens 11, as well as the materials and geometries employed, depend essentially on the requirements for measuring accuracy and on the type of intended use of the sensor 30 (in water, oil, etc.).

It will be understood that the above description of the present invention is susceptible to various modifications, changes and adaptations, and the same are intended to be comprehended within the meaning and range of equivalents of the appended claims.

What is claimed is:

1. A device for measuring electric fields which vary, including electric fields having frequencies extending into the GHz range, comprising:
   an optically active crystal sensor having an option property which changes depending upon the strength of an applied electric field;
   a body contacting said optically active crystal sensor at a common surface portion, said body having a dielectric constant which is different from that of said optically active crystal sensor, said body having a shape and a dielectric constant such that the electric field lines pass through said optically active crystal sensor in a substantially parallel orientation and are substantially perpendicular to two opposed exterior faces of said optically active crystal sensor;
   first optical conductor means connected to a first side of said optically active crystal sensor for supplying light thereto;
   means for polarizing the light supplied to said optically active crystal sensor;
   analyzer means connected to a second side of said optically active crystal sensor for converting shift in phase of the light transmitted through said optically active crystal sensor into a change in intensity of the transmitted light said second side being opposite said first side,
   second optical conductor means connected to said analyzer means for conducting the transmitted light from said analyzer means; and
   detector means for detecting change in the intensity of the transmitted light connected to said second optical conductor means.

2. A device as defined in claim 1, wherein the light supplied by said first optical conductor is oriented in parallel and is shifted in phase by said means for polarizing light such that the supplied light is oriented at an angle of approximately 45° to the direction of the local electric field, wherein said optically active crystal sensor is oriented such that the (1,1,1) plane of said optically active crystal sensor is substantially perpendicular to the local direction of the electric field; and wherein said analyzer means receives the transmitted light from said optically active crystal sensor before it is received by said second optical conductor means.

3. A device as defined in claim 1, wherein said optically active crystal sensor is composed of a $Bi_4Ge_3O_{12}$ crystal.

4. A device as defined in claim 3, wherein said body is composed of plastic.

5. A device as defined in claim 3, wherein said body has a prismatic shape and said optically active crystal sensor has a prismatic shape.

6. A device as defined in claim 1, wherein said optically active crystal sensor is composed of a $Bi_4Si_3O_{12}$ crystal.

7. A device as defined in claim 6, wherein said body is composed of a plastic.

8. A device as defined in claim 6, wherein said body has a prismatic shape and said optically active crystal sensor has a prismatic shape.

9. A device as defined in claim 1, wherein said body and said optically active crystal sensor each have a shape of a right rectangular prism.

* * * * *